(12) United States Patent
Hwang

(10) Patent No.: US 10,991,401 B2
(45) Date of Patent: Apr. 27, 2021

(54) INPUT/OUTPUT CIRCUIT, MEMORY DEVICE HAVING THE SAME, AND OPERATING METHOD THEREOF

(71) Applicant: SK hynix Inc., Gyeonggi-do (KR)

(72) Inventor: Jin Ha Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/357,523

(22) Filed: Mar. 19, 2019

(65) Prior Publication Data

US 2020/0051600 A1 Feb. 13, 2020

(30) Foreign Application Priority Data

Aug. 7, 2018 (KR) .......................... 10-2018-0092031

(51) Int. Cl.
*G11C 7/22* (2006.01)
*G11C 7/10* (2006.01)

(52) U.S. Cl.
CPC ............ *G11C 7/1063* (2013.01); *G11C 7/109* (2013.01)

(58) Field of Classification Search
CPC ......... G11C 7/1063; G11C 7/109; G11C 7/10; H03K 19/082; H03K 19/094; H03K 19/096

USPC ...................................................... 365/189.11
See application file for complete search history.

(56) References Cited

U.S. PATENT DOCUMENTS

| | | | | |
|---|---|---|---|---|
| 7,170,318 | B2 * | 1/2007 | Kim | ................ H03K 19/00384 |
| | | | | 326/26 |
| 7,906,985 | B2 * | 3/2011 | Kim | .................... H03K 17/167 |
| | | | | 326/27 |
| 9,825,631 | B1 * | 11/2017 | Cho | .................... G11C 11/4093 |
| 9,998,121 | B2 * | 6/2018 | Choi | .............. H03K 19/018571 |

FOREIGN PATENT DOCUMENTS

| KR | 10-2006-0050821 | 5/2006 |
|---|---|---|
| KR | 10-0808598 | 3/2008 |

* cited by examiner

*Primary Examiner* — Tha-O H Bui
(74) *Attorney, Agent, or Firm* — IP & T Group LLP

(57) ABSTRACT

An input/output circuit for use in a memory includes: a data pattern detector for outputting an up resistance control code and a down resistance control code according to whether the pattern of consecutively input data is a consecutively varied pattern or an inconsecutively varied pattern; and an output circuit for controlling resistance in response to the up resistance control code and the down resistance control code, and amplifying the data and then outputting the amplified data to an input/output pad.

20 Claims, 8 Drawing Sheets

US 10,991,401 B2

INPUT/OUTPUT CIRCUIT, MEMORY DEVICE HAVING THE SAME, AND OPERATING METHOD THEREOF

CROSS-REFERENCE TO RELATED APPLICATION

The present application claims priority under 35 U.S.C. § 119(a) to Korean patent application number 10-2018-0092031, filed on Aug. 7, 2018, which is incorporated herein by reference in its entirety.

BACKGROUND

Field of Invention

The present disclosure relates to an input/output circuit, a memory device having the same, and an operating method thereof.

Description of Related Art

A memory device may store data and output stored data. For example, the memory device may be configured as a volatile memory device in which stored data is lost when the supply of power is interrupted, or be configured as a nonvolatile memory device in which stored data is retained even when the supply of power is interrupted. The memory device may include a memory cell array for storing data, a peripheral circuit for performing various operations such as program, read, and erase operations, and a control logic for controlling the peripheral circuit.

A memory controller may control data communication between a host and the memory device.

The sizes of electronic devices each using a memory device have been gradually miniaturized, but the amount of data processed by the memory device is continuously increasing. Therefore, a technique for reducing current consumption of the memory device is required.

SUMMARY

Embodiments provide an input/output circuit capable of reducing current consumption and improving performance by controlling resistance of the input/output circuit according to a pattern of data.

In accordance with an aspect of the present disclosure, there is to provided an input/output circuit including: a data pattern detector configured to output an up resistance control code and a down resistance control code according to whether input data has a consecutively varied pattern or an inconsecutively varied pattern; and an output circuit configured to have resistance controlled in response to the up resistance control code and the down resistance control code, amplify the input data, and output the amplified data to an input/output pad.

In accordance with another aspect of the present disclosure, there is provided a memory device including: a memory cell array configured to store data; and a peripheral circuit configured to store data received from a memory controller in the memory cell array in a program operation, read data stored in the memory cell array in a read operation, and output the read data to the memory controller, wherein the peripheral circuit includes an input/output circuit configured to output the read data to the memory controller through an input/output pad by controlling internal resistance according to a pattern of the read data.

In accordance with still another aspect of the present disclosure, there is provided a method for operating a memory device, the method including: reading memory cells; outputting an up resistance control code and a down resistance control code according to a pattern of data read from the memory cells; outputting a pull-up pulse or a pull-down pulse according to the read data; and setting resistance according to the up resistance control code and the down resistance control code, and outputting a first pull-up code or a first pull-down code in response to the pull-up pulse or the pull-down pulse.

In accordance with another aspect of the present disclosure, there is provided an input/output circuit including: a data pad; a data pattern detector activated in response to a data output operation through the data pad to detect a pattern of bits in a sequence of output data and generating a resistance control code based on the detected pattern of bits in the sequence; and an output circuit including a driver having a resistance that is controlled based on the resistance control code, the output circuit suitable for receiving the output data and driving the data pad to output data in accordance with the controlled resistance of the driver, wherein the resistance of the driver is controlled to have a first resistance when all of the bits of the sequence have the same value, a second resistance when a sub-sequence of bits, but not all bits, of the sequence have the same value, and a third resistance when no consecutive bits in the sequence have the same value.

BRIEF DESCRIPTION OF THE DRAWINGS

Various embodiments will now be described more fully with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment," "another embodiment" or the like is not necessarily to only one embodiment, and different references to any such phrase are not necessarily to the same embodiment(s).

DETAILED DESCRIPTION

In the present disclosure, advantages, features and methods for achieving them will become more apparent in light of the following embodiments taken in conjunction with the drawings. Aspects of the present disclosure may, however, be embodied in different forms, and thus the present invention should not be construed as being limited to the embodiments set forth herein. Rather, these embodiments are provided to enable those skilled in the art to which the disclosure pertains to easily practice the present invention.

In the entire specification, when an element is referred to as being "connected" or "coupled" to another element, it can be directly connected or coupled to the another element or be indirectly connected or coupled to the another element with one or more intervening elements interposed. Communication between two elements, whether directly or indirectly connected/coupled, may be wired or wireless, unless the context indicates otherwise. In addition, when an element is referred to as "including" a component, this indicates that the element may further include one or more other components instead of excluding such other component(s), unless the context indicates otherwise.

Figure 1:
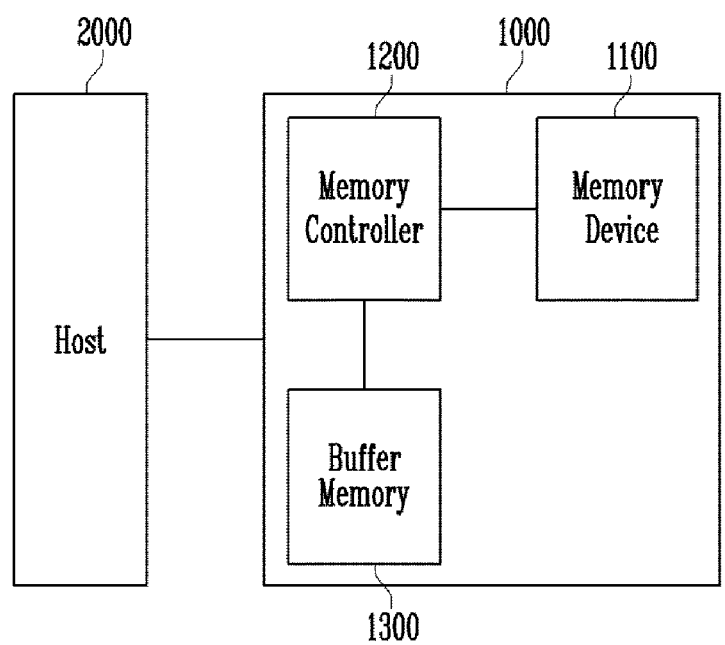
FIG. 1 is a diagram illustrating a memory system.

FIG. 1 is a diagram illustrating a memory system 1000.

Referring to FIG. 1, the memory system 1000 may store data, output stored data or erase stored data in response to a request from a host 2000.

The memory system 1000 may include a memory device 1100 for storing data, a memory controller 1200, and a buffer memory 1300 for temporarily storing data necessary for an operation of the memory system 1000. The memory controller 1200 may control the memory device 1100 and the buffer memory 1300 under the control of the host 2000.

The host 2000 may communicate with the memory system 1000, using at least one of various communication protocols, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

The memory device 1100 may be implemented as a volatile memory device in which data is lost when the supply of power is interrupted or a nonvolatile memory device in which data is retained even when the supply of power is interrupted. The memory device 1100 may perform a program operation, a read operation or an erase operation under the control of the memory controller 1200. For example, in a program operation, the memory device 1100 may receive a command, an address, and data from the memory controller 1200, and perform the program operation. In a read operation, the memory device 1100 may receive a command and an address from the memory controller 1200, and output read data to the memory controller 1200. To this end, the memory device 1100 may include an input and output (input/output) circuit for inputting/outputting data.

The memory controller 1200 may control the overall operations of the memory system 1000, and control data exchange between the host 2000 and the memory device 1100. For example, the memory controller 1200 may program, read or erase data by controlling the memory device 1100 in response to a request from the host 2000. The memory controller 1200 may receive data and a logical address from the host 2000, and translate the logical address into a physical address indicating an area in which data in the memory device 1100 is to be stored. The memory controller 1200 may store, in the buffer memory 1300, a logical-to-physical address mapping table that establishes a mapping relationship between the logical address and the physical address.

The buffer memory 1300 may be used as a working memory or cache memory of the memory controller 1200, and store system data used in the memory system 1000 in addition to the above-described information. In some embodiments, the buffer memory 1300 may include a double data rate synchronous dynamic random access memory (DDR SDRAM), a low power double data rate 4 (LPDDR4) SDRAM, a graphics double data rate (GDDR) SDRAM, a low power DDR (LPDDR), a Rambus dynamic random access memory (RDRAM), etc.

The above-described memory device 1100 will be described in more detail below.

Figure 2:
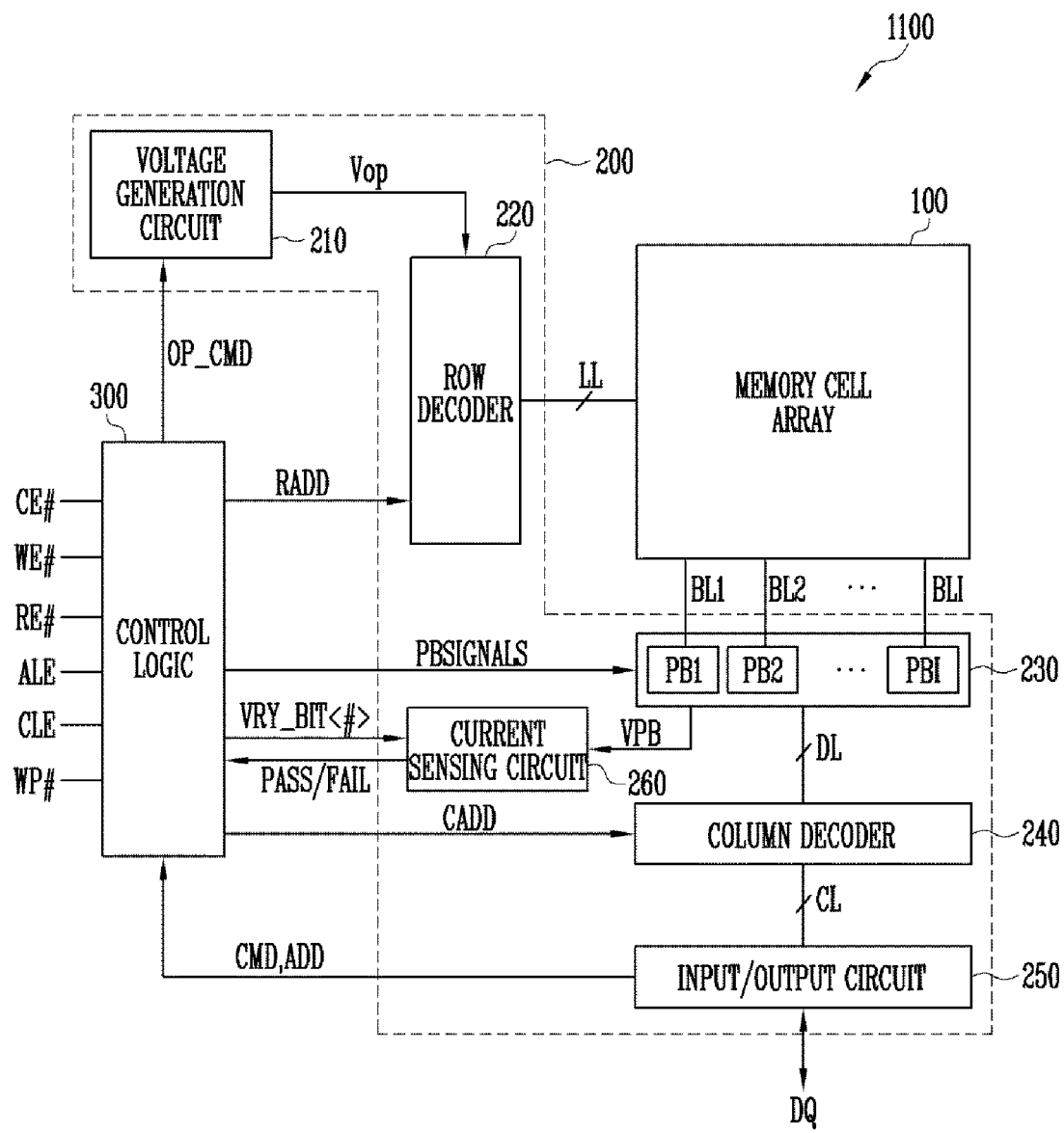
FIG. 2 is a diagram illustrating a memory device, e.g., that of FIG. 1, in accordance with an embodiment of the present disclosure.

FIG. 2 is a diagram illustrating a memory device, e.g., the memory device 1100 of FIG. 1, in accordance with an embodiment of the present disclosure.

Referring to FIG. 2, the memory device 1100 may be implemented to as a volatile memory device or a nonvolatile memory device. Although FIG. 2 illustrates a nonvolatile memory device as an embodiment, this embodiment is not limited to the nonvolatile memory device.

The memory device 1100 may include a memory cell array 100 that stores data. The memory device 1100 may include a peripheral circuit 200 configured to perform a program operation for storing data in the memory cell array 100, a read operation for outputting the stored data, and an erase operation for erasing the stored data. The memory device 1100 may include control logic 300 that controls the peripheral circuit 200 under the control of the memory controller 1200 of FIG. 1.

The memory cell array 100 may include a plurality of memory blocks. User data and various information necessary for an operation of the memory device 1100 may be stored in the memory blocks. The memory blocks may be implemented in a two-dimensional or three-dimensional structure. Recently, memory blocks having a three-dimensional structure have been mainly used so as to improve the degree of integration. Memory blocks having the two-dimensional structure may include memory cells arranged in parallel to a substrate, and memory blocks having the three-dimensional structure may include memory cells stacked vertically to a substrate.

The peripheral circuit 200 may be configured to perform program, read, and erase operations under the control of the control logic 300. For example, the peripheral circuit 200 may include a voltage generation circuit 210, a row decoder 220, a page buffer group 230, a column decoder 240, an input and output (input/output) circuit 250, and a current sensing circuit 260.

The voltage generation circuit 210 may generate various operating voltages Vop used for program, read, and erase operations in response to an operation signal OP_CMD received from the control logic 300. For example, the voltage generation circuit 210 may generate a program voltage, a verify voltage, a pass voltage, a read voltage, an erase voltage, and the like under the control of the control logic 300.

The row decoder 220 may transfer the operating voltages Vop to local lines LL connected to a selected memory block among the memory blocks of the memory cell array 100 in response to a row address RADD. The local lines LL may include local word lines, local drain select lines, and local source select lines. In addition, the local lines LL may include various lines such as a source line, which are connected to the memory block.

The page buffer group 230 may be connected to bit lines BL1 to BLI connected to the memory blocks of the memory cell array 100. The page buffer group 230 may include a plurality of page buffers PB1 to PBI respectively connected to the bit lines BL1 to BLI. The page buffers PB1 to PBI may operate in response to page buffer control signals PBSIGNALS from the control logic 300. For example, the page buffers PB1 to PBI may temporarily store data received through the bit lines BL1 to BLI, or sense voltages or currents of the bit lines BL1 to BLI in a read or verify operation.

The column decoder 240 may transfer data between the input/output circuit 250 and the page buffer group 230 in response to a column address CADD from the control logic 300. For example, the column decoder 240 may exchange data with the page buffers PB1 to PBI through data lines DL, or exchange data with the input/output circuit 250 through column lines CL.

The input/output circuit 250 may receive a command CMD, an address ADD, and data from an external device, e.g., the memory controller 1200 of FIG. 1 through an input/output pad DQ, and output read data to the memory controller 1200 through the input/output pad DQ. For example, the input/output circuit 250 may transfer the command CMD and the address ADD, which are received from the memory controller 1200, to the control logic 300, or exchange the data DATA with the column decoder 240. The input/output circuit 250 in accordance with an embodiment may reduce current consumption by controlling resistance based on a transition of data. The input/output circuit 250 will be described in detail later with reference to FIG. 3.

In a read operation or a verify operation, the current sensing circuit 260 may generate a reference current in response to an allow bit VRY_BIT<#> from the control logic 300, and output a pass signal PASS or a fail signal FAIL by comparing a sensing voltage VPB received from the page buffer group 230 with a reference voltage generated by the reference current.

The control logic 300 may receive the command CMD and the address ADD in response to signals receives through CE #, WE #, RE #, ALE, CLE, ad WP # pads. The control logic 300 may control the peripheral circuit 200 by outputting the operation signal OP_CMD, the row address RADD, the page buffer control signals PBSIGNALS, and the allow bit VRY_BIT<#> in response to the command CMD and the address ADD. The control logic 300 may determine whether the verify operation has passed or failed in response to the pass or fail signal PASS or FAIL.

Figure 3:
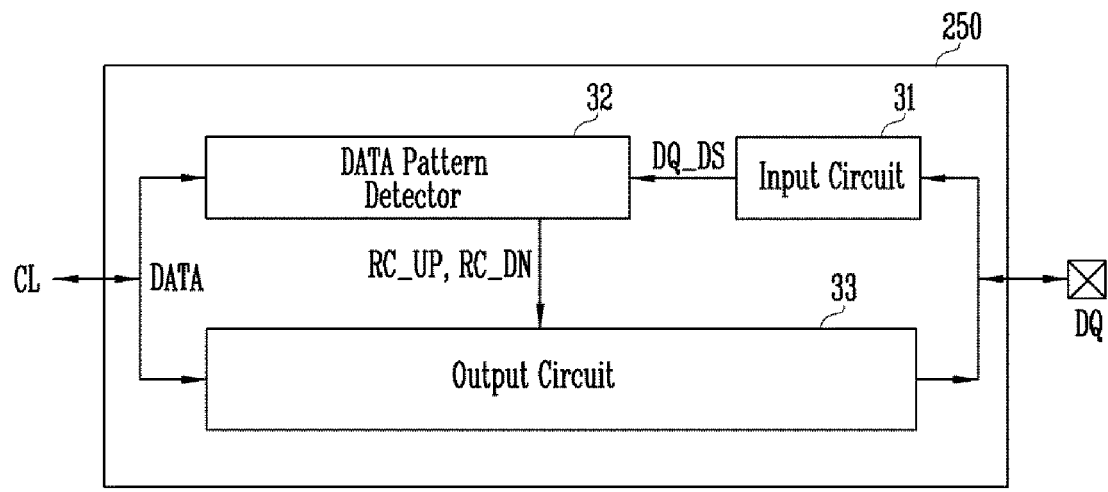
FIG. 3 is a diagram illustrating an input/output circuit in accordance with an embodiment of the present disclosure.

FIG. 3 is a diagram illustrating an input/output circuit, e.g., the input/output circuit 250 of FIG. 2, in accordance with an embodiment of the present disclosure.

Referring to FIG. 3, the input/output circuit 250 may include an input circuit 31, a data pattern detector 32, and an output circuit 33.

The input circuit 31 may receive data through the input/output pad DQ in a program operation. For example, when the memory controller 1200 of FIG. 1 transfers data to the memory device 1100, the input circuit 31 may receive the data, and the received data may be transferred to the page buffer group 230 of FIG. 2 through the column decoder 240 of FIG. 2. The output circuit 33 does not operate in the program operation.

The output circuit 33 may output read data to the memory controller 1200 through the input/output pad DQ in a read operation. In general, an input circuit does not operate in the read operation. However, in this embodiment, the input circuit 31 may detect an output state of the data through the input/output pad DQ, and output a data signal DQ_DS, based on the detection result. For example, the input circuit 31 activates the data signal DQ_DS when output data exists in the input/output pad DQ, and inactivates the data signal DQ_DS when no output data exists in the input/output pad DQ.

The data pattern detector 32 may receive data DATA read through the column lines CL, and output an up resistance control code RC_UP and a down resistance control code RC_DN by detecting a pattern of the received data DATA. Each of the up resistance control code RC_UP and the down resistance control code RC_DN may be configured as a code of at least one bit. When the pattern of the data DATA is consecutively varied, the data pattern detector 32 may output at least one of the resistance control codes RC_UP and RC_DN as a logic high level bit, e.g., '1', according to the pattern of the data DATA. In contrast, when the pattern of the data DATA is not consecutively varied, i.e., when the data DATA is inconsecutively varied, the data pattern detector 32 may output the up resistance control code RC_UP and the down resistance control code RC_DN, each as a logic low level bit, e.g., '0', according to the pattern of the data DATA. That is, the data pattern detector 32 may output the up resistance control code RC_UP and the down resistance control code RC_DN, each of which may have a large number of first value bits (e.g., '1' bits) when the pattern of the data DATA is consecutively varied, and output the up resistance control code RC_UP and the down resistance control code RC_DN, each of which may have a large number of second value bits (e.g., '0' bits) when the pattern of the data DATA is inconsecutively varied.

The output circuit 33 may receive read data DATA through the column lines CL, trim the read data DATA, and output pull-up or pull-down data to the input/output pad DQ. In particular, the output circuit 33 may output data by varying internal resistance of the output circuit 33 according to the up resistance control code RC_UP and the down resistance control code RC_DN. For example, when the read data DATA has a consecutively varied pattern, the output circuit 33 is to rapidly vary data based on the varied pattern and output the varied data, and therefore, the performance of the output circuit 33 may be increased by decreasing the internal resistance. Also, when the read data DATA has an inconsecutively varied pattern, i.e., when the same data is consecutively output, the output circuit 33 does not vary the read data DATA for a certain time, and therefore, power consumption may be reduced by increasing the internal resistance.

Each of the above-described devices will be described in detail as follows.

Figure 4:
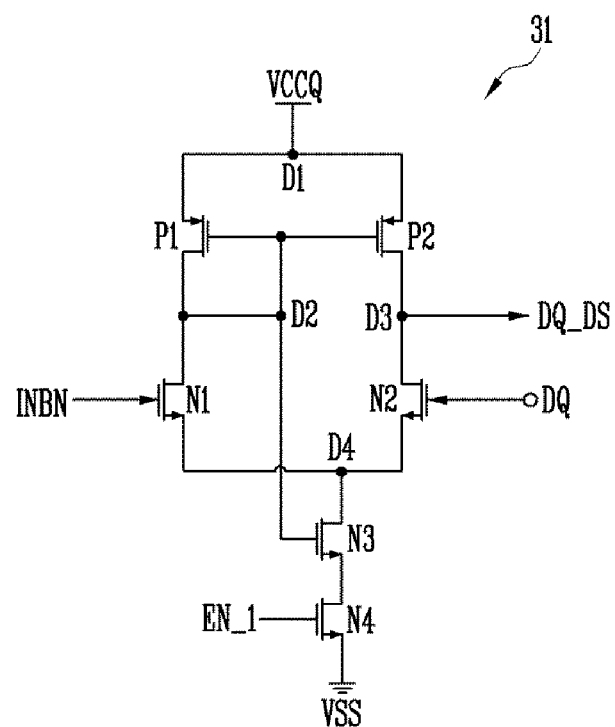
FIG. 4 is a circuit diagram illustrating an input circuit, e.g., that of FIG. 3, in accordance with an embodiment of the present disclosure.

FIG. 4 is a circuit diagram illustrating an input circuit, e.g., the input circuit 31 of FIG. 3, in accordance with an embodiment of the present disclosure.

Referring to FIG. 4, the input circuit 31 may output a data signal DQ_DS in response to data received through the input/output pad DQ. To this end, the input circuit 31 may include a plurality of transistors P1, P2, and N1 to N4 coupled between a power supply voltage terminal VCCQ and a ground terminal VSS. For example, a first PMOS transistor P1 may be coupled between a first node D1 coupled to the power supply voltage terminal VCCQ and a second node D2, and be turned on or turned off in response to a voltage of the second node D2. The first PMOS transistor P1 may be turned on when the voltage of the second node D2 is 0 V or a negative voltage. A second PMOS transistor P2 may be coupled between the first node D1 and a third node D3, and be turned on or turned off in response to the voltage of the second node D2. The second PMOS transistor P2 may be turned on when the voltage of the second node D2 is 0 V or a negative voltage. The third node D3 becomes an output terminal of the input circuit 31.

A first NMOS transistor N1 may be coupled between the second node D2 and a fourth node D4, and be turned on or turned off according to an external voltage INBN. For example, the external voltage INBN may be a voltage equal to an external voltage supplied to the memory device 1100 of FIG. 2. The first NMOS transistor N1 may be turned on when the external voltage INBN is applied as a positive voltage. A second NMOS transistor N2 may be coupled between the third node D3 and the fourth node D4, and be turned on or turned off in response to a voltage of the input/output pad DQ. The second NMOS transistor N2 may be turned on when data having a logic high level, e.g., '1' (data '1') is input to the input/output pad DQ. For example, when the voltage of the input/output pad DQ has a high level, the second NMOS transistor N2 may be turned on.

When the first NMOS transistor N1 is turned on, the voltage of the second node D2 is decreased. Accordingly, when the first and second PMOS transistors P1 and P2 are turned on, a current path may be formed through the first to fourth nodes D1 to D4. Therefore, when a fourth NMOS transistor N4 is turned on and data '1' is input to the input/output pad DQ, the second NMOS transistor N2 is turned on, and hence the data signal DQ_DS may be output as a low level. When data having a logic low level, e.g., '0' (data '0') is input to the input/output pad DQ, the second NMOS transistor N2 may be turned off, and hence the data signal DQ_DS may be output with a high level.

A third NMOS transistor N3 and the fourth NMOS transistor N4 may be coupled in series to each other between the fourth node D4 and the ground terminal VSS. The third NMOS transistor N3 may be coupled between the fourth node D4 and the fourth NMOS transistor N4, and be turned on or turned off in response to the voltage of the second node D2. The fourth NMOS transistor N4 may be coupled between the third NMOS transistor N3 and the ground terminal VSS, and be turned on or turned off in response to an enable signal EN_1. The enable signal EN_1 is activated only when a read operation is performed, and is inactivated when the read operation is not performed. Therefore, the fourth NMOS transistor N4 is turned on only when the read operation is performed.

As described above, the input circuit 31 may output the data signal DQ_DS having the high level when the input/output circuit 250 of FIG. 3 performs an output operation. Since the enable signal EN_1 is activated when the read operation is performed, the data signal DQ_DS may be varied depending on data input to the input/output pad DQ.

The input circuit 31, as illustrated in FIG. 4, represents an embodiment. In addition to the circuit shown in FIG. 4, the input circuit 31 may be configured in various other ways that are capable of outputting the data signal DQ_DS by reflecting data output from the input/output circuit 250 in the output operation.

Figure 5:
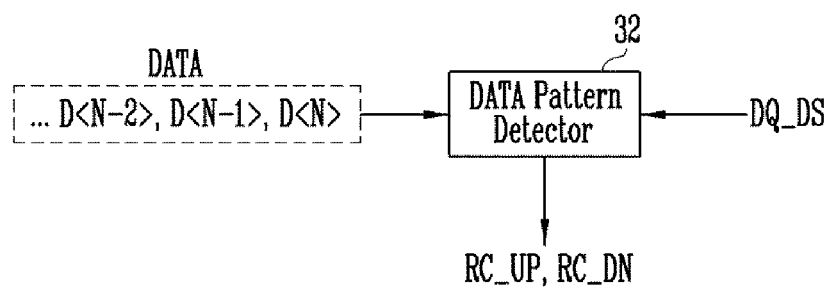
FIG. 5 is a diagram illustrating a data pattern detector, e.g., that of FIG. 3, in accordance with an embodiment of the present disclosure.

FIG. 5 is a diagram illustrating a data pattern detector, e.g., the data pattern detector 32 of FIG. 3, in accordance with an embodiment of the present disclosure.

Referring to FIG. 5, when the data signal DQ_DS is activated, the data pattern detector 32 may output the up resistance control code RC_UP and the down resistance control code RC_DN in response to the received data DATA. For example, the data signal DQ_DS may be activated with a high level in a read operation, and be inactivated in a program operation. Therefore, the data pattern detector 32 may be activated in the read operation, and output the up resistance control code RC_UP and the down resistance control signal RC_DN according to a pattern of read data DATA. The read data DATA may be sequentially input to the data pattern detector 32 through the column lines CL (shown in FIG. 2). For example, it is assumed that, after Nth data D<N> is input, data input next is (N−1)th data D<N−1>, and data input after the data D<N−1> is (N−2)th data D<N−2>. The data pattern detector 32 may output the up resistance control code RC_UP and the down resistance control code RC_DN according to the Nth to (N−2)th data D<N>, D<N−1>, and D<N−2>.

When (N−3)th data is input after the (N−2)th data D<N−2> is input, the data pattern detector 32 may output the up resistance control code RC_UP and the down resistance control code RC_DN according to the (N−1)th to (N−3)th data.

Figure 6:
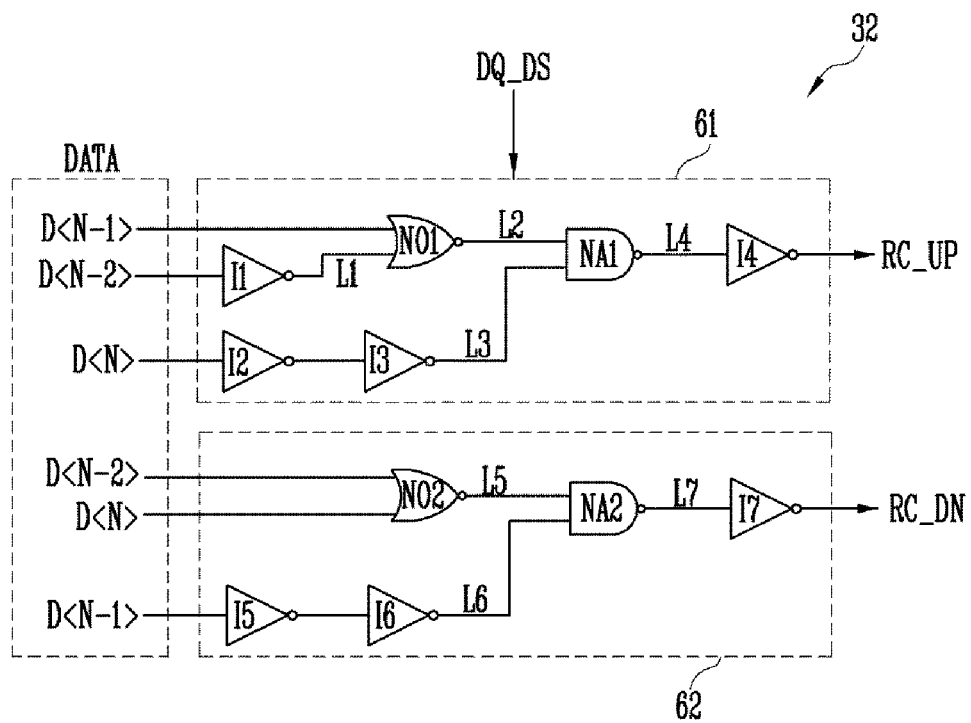
FIG. 6 is a circuit diagram illustrating a data pattern detector, e.g., that of FIG. 5, in accordance with an embodiment of the present disclosure.

FIG. 6 is a circuit diagram illustrating a data pattern detector, e.g., the data pattern detector 32 of FIG. 5, in accordance with an embodiment of the present disclosure.

Referring to FIG. 6, the data pattern detector 32 may be activated in response to the data signal DQ_DS. For example, the data signal DQ_DS may be supplied as a power supply voltage for logic gates (e.g., NOR gates, NAND gates) included in the data pattern detector 32.

The data pattern detector 32 may output the up resistance control code RC_UP and the down resistance control code RC_DN according to a pattern of consecutive data corresponding to a set bit number. In this embodiment, the data pattern detector 32 capable of outputting the up resistance control code RC_UP and the down resistance control code RC_DN according to a pattern of three consecutive data, e.g., bits of the same value (three consecutive 0's or 1's) will be described as an example. The number of bits in a pattern is not limited to three. Data pattern detector 32 may be configured to detect other numbers of data or bits.

The data pattern detector 32 may include a first pattern detection circuit 61 and a second pattern detection circuit 62.

The first pattern detection circuit 61 may control resistance of circuits transmitting data having a logic high level (high data). The second pattern detection circuit 62 may control resistance of circuits transmitting data having a logic low level (low data).

The first pattern detection circuit 61 may include first to fourth inverters I1 to I4, a first NOR gate NO1, and a first NAND gate NA1. The first inverter I1 may output a first logic value L1 by inverting the (N−2)th data D<N−2>. The first NOR gate NO1 may output a second logic value L2 by performing a NOR operation on the (N−1)th data D<N−1> and the first logic value L1. The second and third inverters I2 and I3 may output a third logic value L3 by delaying the Nth data D<N>. The first NAND gate NA1 may output a fourth logic value L4 by performing a NAND operation on the second and third logic values L2 and L3. The fourth inverter I4 may output the up resistance control code RC_UP by inverting the fourth logic value L4.

The second pattern detection circuit 62 may include fifth to seventh inverters I5 to I7, a second NOR gate NO2, and a second NAND gate NA2. The second NOR gate NO2 may output a fifth logic value L5 by performing a NOR operation on the (N−2)th data D<N−2> and the Nth data D<N>. The fifth and sixth inverters I5 and I6 may output a sixth logic value L6 by delaying the (N−1)th data D<N−1>. The second NAND gate NA2 may output a seventh logic value L7 by performing a NAND operation on the fifth and sixth logic values L5 and L6. The seventh inverter I7 may output the down resistance control code RC_DN by inverting the seventh logic value L7.

The up resistance control code RC_UP and the down resistance control code RC_DN output according to D<N>, D<N−1>, and D<N−2> will be described in detail as follows.

Figure 7:
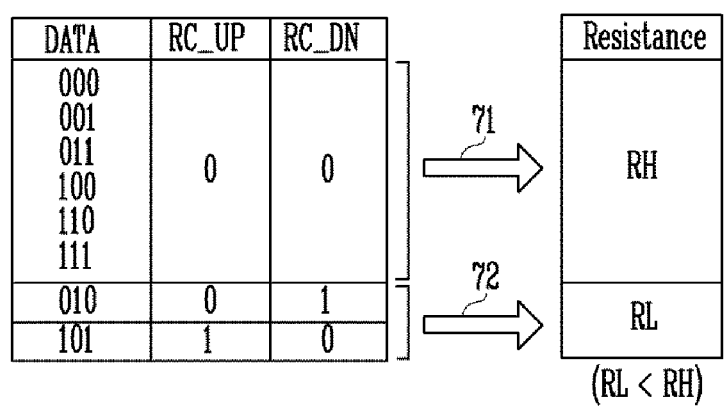
FIG. 7 is a diagram illustrating codes output from a data pattern detector in accordance with an embodiment of the present disclosure.

FIG. 7 is a diagram illustrating codes output from a data pattern detector, e.g., the data pattern detector 32 of FIG. 6, in accordance with an embodiment of the present disclosure.

Referring to FIG. 7, the data pattern detector 32 may output the up resistance control code RC_UP and the down resistance control code RC_DN by detecting whether input data DATA is consecutively varied or is inconsecutively varied. For example, when the input data DATA is inconsecutively varied, at least two consecutive bits of a set sequence of DATA are of the same value, and therefore, circuits for varying data may not operate with the maximum performance. On the other hand, when the input data DATA is consecutively varied, i.e., no two consecutive bits of a set sequence are of the same value, circuits for varying data are to operate with the maximum performance. To this end, in this embodiment, internal resistance may be increased or decreased by distinguishing a case 71 where the data is inconsecutively varied from a case 72 where the data is consecutively varied. For example, in the case 71 where the data is inconsecutively varied, the internal resistance may be increased to have high resistance (RH). In the case 72 where the data is consecutively varied, the internal resistance may be decreased to have low resistance (RL).

It is assumed that the data DATA shown in FIG. 7 are input in a sequence of the (N−2)th data, the (N−1)th data, and the Nth data. The sequence may be changed depending on a circuit configuration of the data pattern detector 32.

In the case 71 input data DATA that is inconsecutively varied may be any one of '000,' '001,' '011,' '100,' '110,' and '111.' When this data is input, both the up resistance control code RC_UP and the down resistance control code RC_DN may be output as '0' from the data pattern detector 32. That is, when the code output from the data pattern detector 32 is '00,' the internal resistance may be set as high resistance RH. The internal resistance may be resistance of the output circuit 33 of FIG. 3. In other words, in the case 71 where the input data DATA is inconsecutively varied, the resistance of the output circuit 33 is increased, so that power consumption may be reduced.

In the case 72 input data DATA that is consecutively may be '010' or '101.' When this data is input, either the up resistance control code RC_UP or the down resistance control code RC_DN may be output as '1' from the data pattern detector 32, depending on whether there is more 0's or 1's in the DATA. For example, when a number of bits '1' is greater than that of bits '0' in the consecutively varied data, the up resistance control code RC_UP may be '1,' and the down resistance control code RC_DN may be '0.' Alternatively, when a number of bits '0' is greater than that of bits '1' in the consecutively varied data, the down resistance control code RC_DN may be '1,' and the up resistance control code RC_UP may be '0.'

When the code output from the data pattern detector 32 is '10' or '01,' the internal resistance may be set as low resistance RL. In other words, in the case 72 where the input data DATA is consecutively varied, the resistance of the output circuit 33 of FIG. 3 is decreased, so that operating performance of the output circuit 33 may be enhanced. The operating performance may mean an operation speed of the output circuit 33.

Figure 8:
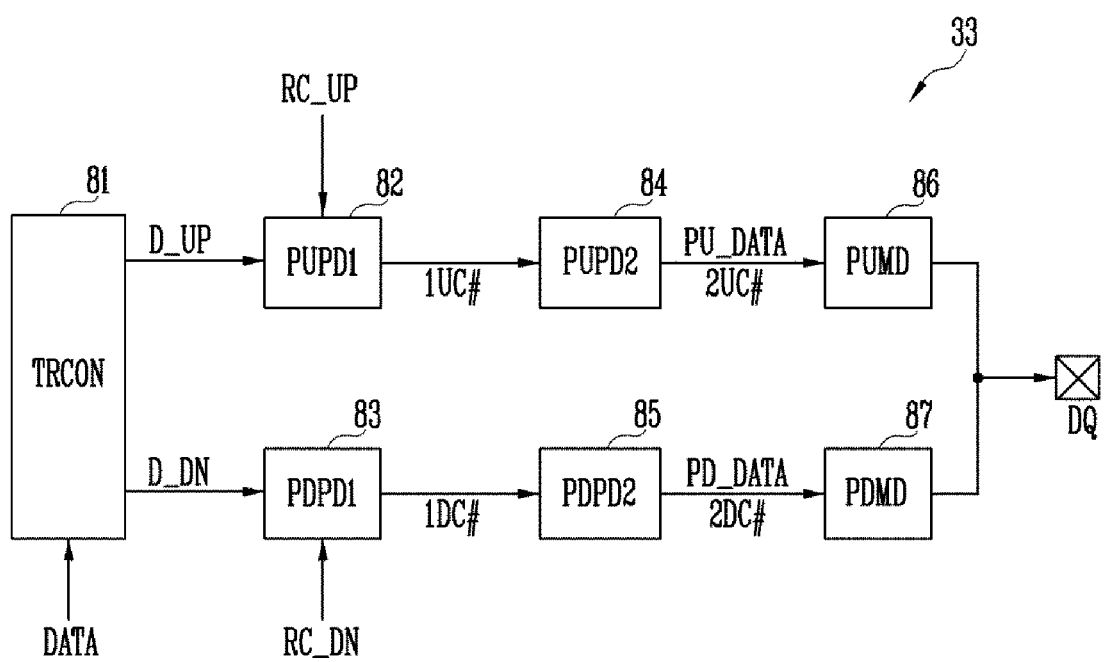
FIG. 8 is a circuit diagram illustrating an output circuit, e.g., that of FIG. 3, in accordance with an embodiment of the present disclosure.

FIG. 8 is a circuit diagram illustrating an output circuit, e.g., the output circuit 33 of FIG. 3, in accordance with an embodiment of the present disclosure.

Referring to FIG. 8, the output circuit 33 may correct and amplify data DATA received through the column lines CL of FIG. 2, and output the corrected and amplified data through the input/output pad DQ. To this end, the output circuit 33 may include a trigger controller (TRCON) 81, a first pull-up pre-driver (PUPD1) 82, a first pull-down pre-driver (PDPD1) 83, a second pull-up pre-driver (PUPD2) 84, a second pull-down pre-driver (PDPD2) 85, a pull-up main driver (PUMD) 86, and a pull-down main driver (PDMD) 87.

The TRCON 81 may receive data DATA from the column lines CL, and output a pull-up pulse D_UP and a pull-down pulse D_DN according to the received data. The pull-up pulse D_UP may be a signal having a logic high level, and the pull-down pulse D_DN may be a signal having a logic low level.

The PUPD1 82 may receive the pull-up pulse D_UP, and output a first pull-up code 1UC # including a pull-up signal in response to the up resistance control code RC_UP. For example, the PUPD1 82 may output the first pull-up code 1UC # configured with a plurality of bits by trimming the pull-up pulse D_UP. The PUPD1 82 may output the first pull-up code 1UC # including a pull-up signal having the same level as the pull-up pulse D_UP. For example, the first pull-up code 1UC # may be configured with a plurality of bits. Any one bit among the plurality of bits may be a pull-up signal, and the other bits may be pull-up trimming codes.

The PUPD1 82 may include an off-chip driver (OCD) and an on-die termination (ODT) circuit (not shown). For example, the OCD may output the first pull-up code 1UC # configured with a plurality of bits according to the level of the pull-up pulse D_UP. The ODT circuit may control resistance of lines or pins from which the first pull-up code 1UC # is output in response to the up resistance control code RC_UP. In various embodiments, the PUPD1 82 may include switches for outputting the first pull-up code 1UC # including the pull-up signal in response to the pull-up pulse D_UP. The resistance of the switches may be varied depending on the up resistance control code RC_UP. For example, when the up resistance control code RC_UP is '0,' the resistance of the switches may be increased. When the up resistance control code RC_UP is '1,' the resistance of the switches may be decreased.

When the resistance of the switches is increased, power consumption may be reduced. When the resistance of the switches is decreased, although power consumption is increased, the operation speed may be increased. Thus, the PUPD1 82 may operate according to a variation state of data.

The PDPD1 83 may receive the pull-down pulse D_DN, and output a first pull-down code 1DC # in response to the down resistance control code RC_DN. For example, the PDPD1 83 may output the first pull-down code 1DC # configured with a plurality of bits by trimming the pull-down pulse D_DN. The PDPD1 83 may output the first pull-down code 1DC # including a pull-down signal having the same level as the pull-down pulse D_DN. For example, the first pull-down code 1DC # may be configured with a plurality of bits. Any one bit among the plurality of bits may be a pull-down signal, and the other bits may be calibration codes (or pull-down trimming codes).

The PDPD1 83 may include an off-chip driver (OCD) and an on-die termination (ODT) circuit (not shown). For example, the OCD may output the first pull-down code 1DC # configured with a plurality of bits according to a level of the pull-down pulse D_DN. The ODT circuit may control resistance of lines or pins from which the first pull-down code 1DC # is output in response to the down resistance control code RC_DN. In various embodiments, the PDPD1 83 may include switches for outputting the first pull-down code 1DC # including the pull-down signal in response to the pull-down pulse D_DN. The resistance of the switches may be varied depending on the down resistance control code RC_DN. For example, when the down resistance control code RC_DN is '0,' the resistance of the switches may be increased. When the down resistance control code RC_DN is '1,' the resistance of the switches may be decreased.

The PUPD2 84 may output pull-up data PU_DATA and a second pull-up code 2UC # in response to the first pull-up code 1UC #. The pull-up data PU_DATA for determining a high level of output data DOUT may be output as inverted data of the pull-up signal. The pull-up data PU_DATA may be output by reflecting the swing width of a received pull-up signal as it is. For example, the PUPD2 84 may output low pull-up data PU_DATA when the received pull-up signal has a high level, and output high pull-up data PU_DATA when the received pull-up signal has a low level. The second pull-up code 2UC # may be output by re-trimming a pull-up trimming code included in the received first pull-up code 1UC #. For example, the PUPD2 84 may output the second pull-up code 2UC # by correcting the level of a pull-up trimming code included in the first pull-up code 1UC # according to a set signal strength. For example, the second pull-up code 2UC # may have a signal strength different from that of the first pull-up code 1UC #, but may be configured with the same data as the first pull-up code 1UC #.

The PDPD2 85 may output pull-down data PD_DATA and a second pull-down code 2DC # in response to the first pull-down code 1DC #. The pull-down data PD_DATA for determining a low level of the output data DOUT may be output as inverted data of the pull-down signal. The pull-down data PD_DATA may be output by reflecting the swing width of a received pull-down signal as it is. For example, the PDPD2 85 may output low pull-down data PD_DATA when the received pull-down signal has a high level, and output high pull-down data PD_DATA when the received pull-down signal has a low level. The second pull-down code 2DC # may be output by re-trimming a pull-down trimming code included in the received first pull-down code 1DC #. For example, the PDPD2 85 may output the second pull-down code 2DC # by correcting the level of a calibration code included in the first pull-down code 1DC # according to a set signal strength. For example, the second pull-down code 2DC # may have a signal strength different from that of the first pull-down code 1DC #, but may be configured with the same data as the first pull-down code 1DC #.

The PUMD 86 may output high data to the input/output pad DQ in response to receiving the pull-up data PU_DATA and the second pull-up code 2UC #. For example, the PUMD 86 may output the high data to the input/output pad DQ when the low pull-up data PU_DATA is received. When the high pull-up data PU_DATA is received, the PUMD 86 does not output data. That is, when the PUMD 86 does not output data, an output node of the PUMD 86 may be floated.

The PDMD 87 may output low data to the input/output pad DQ in response to receiving the pull-down data PD_DATA and the second pull-down code 2DC #. For example, the PDMD 87 may output the low data to the input/output pad DQ when the high pull-down data PD_DATA is received. When the low pull-down data PD_DATA is received, the PDMD 87 does not output data. That is, when the PDMD 87 does not output data, an output node of the PDMD 87 may be floated.

Figure 9:
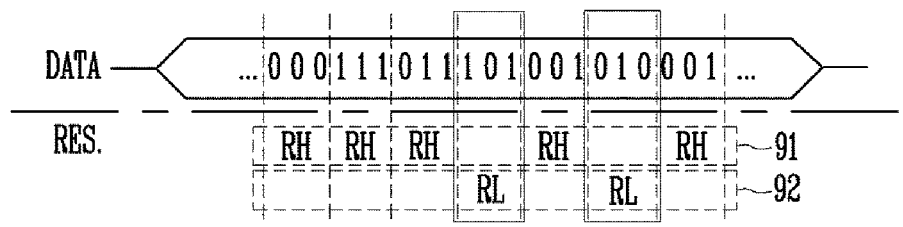
FIG. 9 is a diagram illustrating a method of controlling resistance based on data in accordance with an embodiment of the present disclosure.

FIG. 9 is a diagram illustrating a method of controlling resistance based on data in accordance with an embodiment of the present disclosure.

Referring to FIG. 9, when data DATA sequentially input to the data pattern detector 32 of FIG. 3 is '000,' the pattern is consecutive 0's. Hence, the pattern is deemed to be inconsecutively varied, because at least two consecutive bits in the sequence are the same value. Therefore, the data pattern detector 32 of FIG. 3 may output code '00' (see FIG. 7), and the PUPD1 82 and the PDPD1 83 of FIG. 8 may operate in a high resistance (RH) mode 91 according to the code '00.'

As is the case for '000,' the pattern in a sequence '111' is not varied, and therefore, the PUPD1 82 and the PDPD1 83 of FIG. 8 may operate in the high resistance (RH) mode 91.

In a pattern of data such as '011' or '001,' a sub-sequence thereof (11 or 00) is not varied but maintained, and hence high performance of the PUPD1 82 and the PDPD1 83 is not required. Therefore, in the pattern of data such as '011' or '001,' the PUPD1 82 and the PDPD1 83 may operate in the high resistance (RH) mode 91.

In the pattern of data such as '101' or '010,' the data is consecutively varied, e.g., the bits alternate in value, and hence the performance of the PUPD1 82 and the PDPD1 83 is to be maximized. Therefore, in the consecutively varied pattern, the data pattern detector 32 may output code '01' or '10' (see FIG. 7), and the PUPD1 82 and the PDPD1 83 may operate in a low resistance (RL) mode 92 according to the code '01' or '10.'

As described above, internal resistance is controlled according to the pattern of the data DATA, so that power consumption may be reduced in a partial period, and the operation speed may be increased in another period.

Although FIG. 9 illustrates a method in which the PUPD1 82 and the PDPD1 83 are implemented in the high resistance (RH) mode 91 or the low resistance (RL) mode 92 according to the data DATA, a large number of codes may be output by modifying the configuration of the data pattern detector 32, and the resistance of the PUPD1 82 and the PDPD1 83 may be more minutely controlled when the number of bits of an output code increases. An embodiment related to this will be described with reference to FIG. 10.

Figure 10:
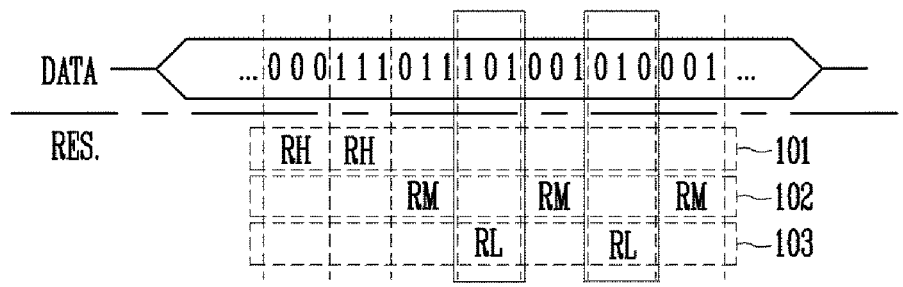
FIG. 10 is a diagram illustrating a method of controlling resistance based on data in accordance with another embodiment of the present disclosure.

FIG. 10 is a diagram illustrating a method of controlling resistance based on data in accordance with an embodiment of the present disclosure.

Referring to FIG. 10, the PUPD1 82 and the PDPD1 83 of FIG. 8 may operate in a high resistance (RH) mode 101, a middle resistance (RM) mode 102, and a low resistance (RL) mode 103 according to read data DATA.

The high resistance mode 101 may be a case where data is not varied, e.g., a case where the data is '000' or '111,' e.g., consecutive bits of the same value.

The middle resistance mode 102 may be a case where a portion of data is not varied, e.g., a case where the data is '011' or '001,' e.g., the data has a sub-sequence of consecutive bits of the same value.

The low resistance mode 103 may be a case where data is consecutively varied, e.g., a case where the data is '101' or '010,' e.g., a sequence of bits of alternating values.

In the above-described embodiment, resistance is controlled according to the pattern of three data bits. However, it will be understood by those skilled in the art that the resistance may be controlled according to the pattern of any suitable number of bits, e.g., a pattern of two or four bits. This may be realized by modifying the design of the data pattern detector 32, the PUPD1 82 and the PDPD1 83, in accordance with the teachings herein.

Figure 11:
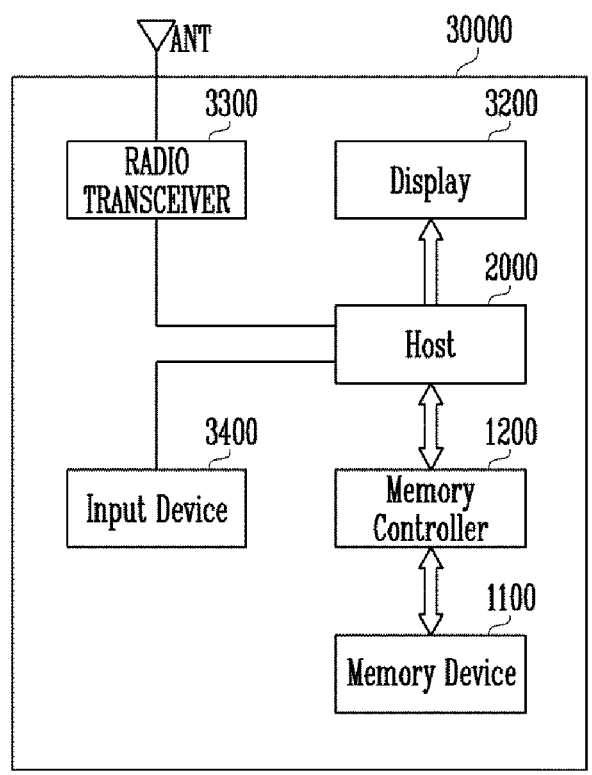
FIG. 11 is a diagram illustrating a memory system including a memory device, e.g., that shown in FIG. 2, in accordance with an embodiment of the present disclosure.

FIG. 11 is a diagram illustrating a memory system, e.g., a memory system 30000 including the memory device shown in FIG. 2, in accordance with an embodiment of the present disclosure.

Referring to FIG. 11, the memory system 30000 may be implemented as a cellular phone, a smart phone, a tablet personal computer (PC), a personal digital assistant (PDA), or a wireless communication device.

The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a host 2000.

Data programmed in the memory device 1100 may be output through a display 3200 under the control of the memory controller 1200.

A radio transceiver 3300 may transmit and receive radio signals through an antenna ANT. For example, the radio transceiver 3300 may convert a radio signal received through the antenna ANT into a signal that can be processed by the host 2000. Therefore, the host 2000 may process a signal output from the radio transceiver 3300 and transmit the processed signal to the memory controller 1200 or the display 3200. The memory controller 1200 may transmit the signal processed by the host 2000 to the semiconductor memory device 1100. Also, the radio transceiver 3300 may convert a signal output from the host 2000 into a radio signal, and output the converted radio signal to an external device through the antenna ANT. An input device 3400 is a device capable of inputting a control signal for controlling an operation of the host 2000 or data to be processed by the host 2000, and may be implemented as a pointing device such as a touch pad or a computer mount, a keypad, or a keyboard. The host 2000 may control an operation of the display 3200 such that data output from the memory controller 1200, data output from the radio transceiver 3300, or data output from the input device 3400 can be output through the display 3200.

Figure 12:
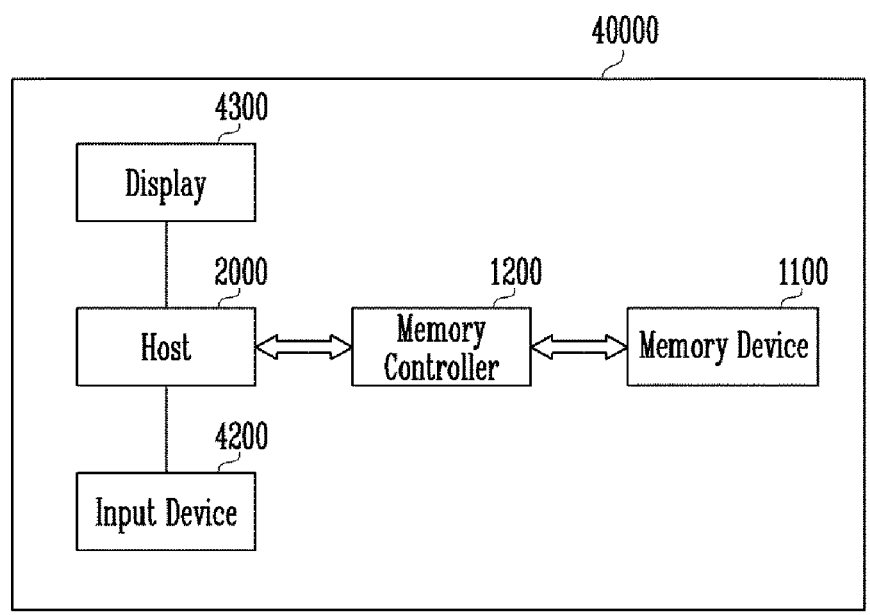
FIG. 12 is a diagram illustrating a memory system including a memory device, e.g., that shown in FIG. 2, in accordance with an embodiment of the present disclosure.

FIG. 12 is a diagram illustrating a memory system, e.g., a memory system 40000 including the memory device shown in FIG. 2, in accordance with an embodiment of the present disclosure.

Referring to FIG. 12, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling a data processing operation of the memory device 1100.

A host 2000 may output data stored in the memory device 1100 through a display 4300 according to data input through an input device 4200. For example, the input device 4200 may be implemented as a pointing device such as a touch pad or a computer mouse, a keypad, or a keyboard.

The host 2000 may control the overall operations of the memory system 40000, and control an operation of the memory controller 1200.

Figure 13:
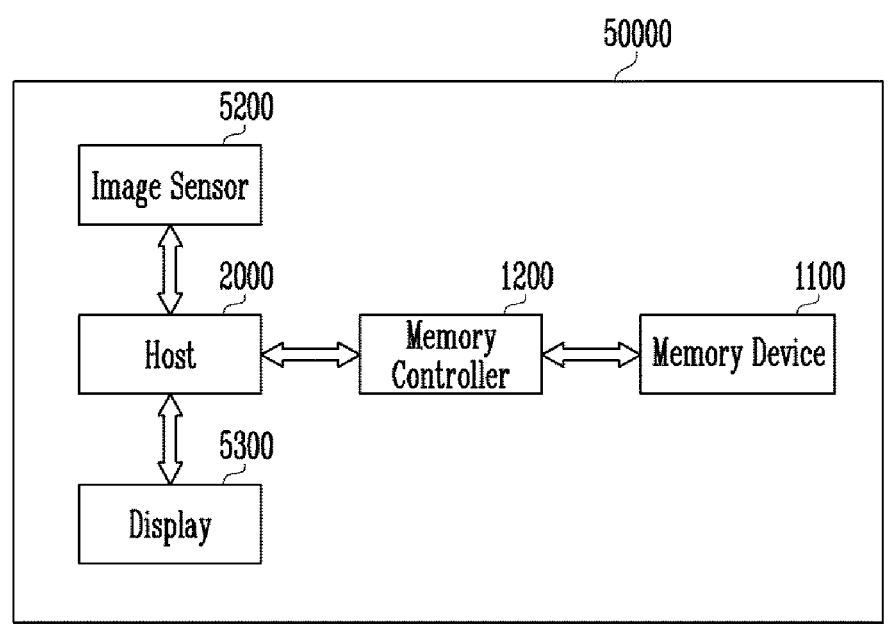
FIG. 13 is a diagram illustrating a memory system including a memory device, e.g., that shown in FIG. 2, in accordance with an embodiment of the present disclosure.

FIG. 13 is a diagram illustrating a memory system, e.g., a memory system 50000 including the memory device shown in FIG. 2, in accordance with an embodiment of the present disclosure.

Referring to FIG. 13, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a host 2000 or the memory controller 1200. Under the control of the host 2000, the converted digital signals may be output through a display 5300, or be stored in the memory device 1100 through the memory controller 1200. In addition, data stored in the memory device 1100 may be output through the display 5300 under the control of the host 2000.

Figure 14:
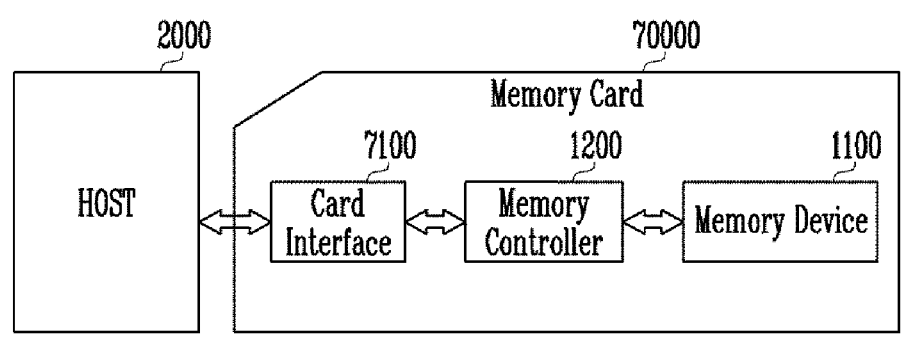
FIG. 14 is a diagram illustrating a memory system including a memory device, e.g., that shown in FIG. 2, in accordance with an embodiment of the present disclosure.

FIG. 14 is a diagram illustrating a memory system, e.g., a memory system including the memory device shown in FIG. 2, in accordance with an embodiment of the present disclosure.

Referring to FIG. 14, the memory system may include a host 2000 and a memory card 70000.

The memory card 70000 may be implemented with a smart card. The memory card 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the card interface 7100 may interface data exchange between a host 2000 and the memory controller 1200 according to a protocol of the host 2000. In some embodiments, the card interface 7100 may support a universal serial bus (USB) protocol and an inter-chip (IC)-USB protocol. The card interface 7100 may mean hardware capable of supporting a protocol used by the host 2000, software embedded in the hardware, or a signal transmission scheme.

In accordance with embodiments of the present disclosure, the input/output circuit controls resistance of the input/output circuit according to a pattern of data, so that current consumption of the memory device including the input/output circuit can be reduced, and the performance of the input/output circuit can be improved.

Various embodiments have been disclosed herein, and although specific terms are employed, they are used and are to be interpreted in a generic and descriptive sense and not for purpose of limitation. In some instances, as would be apparent to those skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An input/output circuit comprising:
   a data pattern detector configured to output an up resistance control code and a down resistance control code according to whether input data has a consecutively varied pattern or an inconsecutively varied pattern; and
   an output circuit configured to have resistance controlled in response to the up resistance control code and the down resistance control code, amplify the input data, and output the amplified data to an input/output pad,
   wherein the data pattern detector identifies that the input data has the inconsecutively varied pattern, based on at least two consecutive bits of the input data are of a same value.

2. The input/output circuit of claim 1, wherein the data pattern detector:
   when bits of the input data are consecutively varied, at least one of the up resistance control code and the down resistance control code is designated by at least one bit of a first value; and
   when the bits of the input data are inconsecutively varied, the up resistance control code and the down resistance control code are each designated by at least one bit of a second value.

3. The input/output circuit of claim 1, wherein the output circuit includes:
   a trigger controller configured to receive the input data, and output a pull-up pulse and a pull-down pulse according to the received data;
   a first pull-up pre-driver configured to vary first internal resistance in response to the up resistance control code, and output a first pull-up code including a pull-up signal in response to the pull-up pulse;
   a first pull-down pre-driver configured to vary second internal resistance in response to the down resistance control code, and output a first pull-down code including a pull-down signal in response to the pull-down pulse;
   a second pull-up pre-driver configured to output pull-up data and a second pull-up code in response to the first pull-up code;
   a second pull-down pre-driver configured to output pull-down data and a second pull-down code in response to the first pull-down code;
   a pull-up main driver configured to output data of a logic high level to the input/output pad in response to the pull-up data and the second pull-up code; and
   a pull-down main driver configured to output data of a logic low level to the input/output pad in response to the pull-down data and the second pull-down code.

4. The input/output circuit of claim 3, wherein the first pull-up pre-driver decreases the first internal resistance when the up resistance control code is designated by at least one bit of a first value, and increases the first internal resistance when the up resistance control code is designated by at least one bit of a second value.

5. The input/output circuit of claim 3, wherein the first pull-down pre-driver decreases the second internal resistance when the down resistance control code is designated by at least one bit of a first value, and increases the second internal resistance when the down resistance control code is designated by at least one bit of a second value.

6. A memory device comprising:
   a memory cell array configured to store data; and
   a peripheral circuit configured to store data received from a memory controller in the memory cell array in a program operation, read data stored in the memory cell array in a read operation, and output the read data to a memory controller,
   wherein the peripheral circuit includes an input/output circuit configured to output the read data to the memory controller through an input/output pad by controlling internal resistance according to a pattern of the read data, and
   wherein the pattern of the read data is identified whether the read data has the inconsecutively varied pattern, based on at least two consecutive bits of the read data are of a same value.

7. The memory device of claim 6, wherein the input/output circuit includes:
   an input circuit configured to receive the read data from the memory controller through the input/output pad in the program operation, and output a data signal in the read operation;
   a data pattern detector configured to operate in response to the data signal, and output an up resistance control code and a down resistance control code according to the pattern of the read data; and
   an output circuit configured to have resistance controlled in response to the up resistance control code and the down resistance control code, amplify the read data, and output the amplified data to the input/output pad.

8. The memory device of claim 7, wherein the input circuit:
   inactivates the data signal in the program operation; and
   activates the data signal in the read operation.

9. The memory device of claim 8, wherein the data signal is used as a power supply voltage of logic gates of the data pattern detector.

10. The memory device of claim 9, wherein the data pattern detector operates when the data signal is activated, and does not operate when the data signal is inactivated.

11. The memory device of claim 7, wherein the data pattern detector:
    when the read data is consecutively varied, at least one of the up resistance control code and the down resistance control code is designated by at least one bit of a first value, and when the read data is inconsecutively varied, the up resistance control code and the down resistance control code are each designated by at least one bit of a second value.

12. The memory device of claim 7, wherein the output circuit includes:
   a trigger controller configured to output a pull-up pulse and a pull-down pulse according to the read data;
   a first pull-up pre-driver configured to vary first internal resistance in response to the up resistance control code, and output a first pull-up code including pull-up data in response to the pull-up pulse;
   a first pull-down pre-driver configured to vary second internal resistance in response to the down resistance control code, and output a first pull-down code including pull-down data in response to the first pull-down pulse;
   a second pull-up pre-driver configured to output the pull-up data and a second pull-up code in response to the first pull-up code;
   a second pull-down pre-driver configured to output the pull-down data and a second pull-down code in response to the first pull-down code;
   a pull-up main driver configured to output data of a logic high level to the input/output pad in response to the pull-up data and the second pull-up code; and
   a pull-down main driver configured to output data of a logic low level to the input/output pad in response to the pull-down data and the second pull-down code.

13. The memory device of claim 12, wherein the first pull-up pre-driver decreases the first internal resistance when the up resistance control code is designated by at least one bit of a first value, and increases the first internal resistance when the up resistance control code is designated by at least one bit of a second value.

14. The memory device of claim 12, wherein the first pull-down pre-driver decreases the second internal resistance when the down resistance control code is designated by at least one bit of a first value, and increases the second internal resistance when the down resistance control code is designated by at least one bit of a second value.

15. A method for operating a memory device, the method comprising:
   reading memory cells;
   outputting an up resistance control code and a down resistance control code according to a pattern of data read from the memory cells;
   outputting a pull-up pulse or a pull-down pulse according to the read data; and
   setting resistance according to the up resistance control code and the down resistance control code, and outputting a first pull-up code or a first pull-down code in response to the pull-up pulse or the pull-down pulse,
   wherein the pattern of the read data is identified whether the read data has the inconsecutively varied pattern, based on at least two consecutive bits of the read data are of a same value.

16. The method of claim 15, wherein the outputting of the up resistance control code and the down resistance control code comprises:
   when bits of the read data are consecutively varied, designating at least one of the up resistance control code and the down resistance control code by at least one bit of a first value, and
   when the bits of the read data is inconsecutively varied, designating each of the up resistance control code and the down resistance control code by at least one bit of a second value.

17. The method of claim 16, wherein the bits of the read data consecutively varied include '101' or '010,' and
   wherein the bits of the read data inconsecutively varied include '000,' '001,' '011,' '100,' '110' or '111'.

18. The method of claim 15, wherein the first pull-up code includes a pull-up signal corresponding to the read data and a pull-up trimming code for trimming the read data, and
   the first pull-down code includes a pull-down signal corresponding to the read data and a pull-down trimming code for trimming the read data.

19. The method of claim 18, further comprising: after the outputting of the first pull-up code or the first pull-down code,
   outputting pull-up data for determining a logic high level of output data and a second pull-up code including a code obtained by re-trimming the pull-up trimming code in response to the first pull-up code, or outputting pull-down data for determining a logic low level of output data and a second pull-down code including a code obtained by re-trimming the pull-down trimming code in response to the first pull-down code; and
   outputting data of a logic high level or data of a logic low level to an input/output pad in response to the second pull-up code or the second pull-down code.

20. An input/output circuit comprising:
   a data pad;
   a data pattern detector activated in response to a data output operation through the data pad to detect a pattern of bits in a sequence of output data and generating a resistance control code based on the detected pattern of bits in the sequence; and
   an output circuit including a driver having a resistance that is controlled based on the resistance control code, the output circuit suitable for receiving the output data and driving the data pad to output data in accordance with the controlled resistance of the driver,
   wherein the resistance of the driver is controlled to have a first resistance when all of the bits of the sequence have the same value, a second resistance when a sub-sequence of bits, but not all bits, of the sequence have the same value, and a third resistance when no consecutive bits in the sequence have the same value,
   wherein the data pattern detector identifies that the input data has the inconsecutively varied pattern, based on at least two consecutive bits of the input data are of a same value.

* * * * *